(12) United States Patent
Chen et al.

(10) Patent No.: US 10,109,736 B2
(45) Date of Patent: Oct. 23, 2018

(54) SUPERLATTICE BUFFER STRUCTURE FOR GALLIUM NITRIDE TRANSISTORS

(71) Applicant: Taiwan Semiconductor Manufacturing Co., Ltd., Hsin-Chu (TW)

(72) Inventors: Chi-Ming Chen, Zhubei (TW); Chung-Yi Yu, Hsin-Chu (TW); Po-Chun Liu, Hsinchu (TW)

(73) Assignee: Taiwan Semiconductor Manufacturing Co., Ltd., Hsin-Chu (TW)

(*) Notice: Subject to any disclaimer, the term of this patent is extended or adjusted under 35 U.S.C. 154(b) by 21 days.

(21) Appl. No.: 14/620,399

(22) Filed: Feb. 12, 2015

(65) Prior Publication Data
US 2016/0240679 A1 Aug. 18, 2016

(51) Int. Cl.
H01L 29/06 (2006.01)
H01L 29/78 (2006.01)
H01L 29/15 (2006.01)
H01L 29/205 (2006.01)
H01L 21/02 (2006.01)
H01L 29/66 (2006.01)

(52) U.S. Cl.
CPC ...... H01L 29/7849 (2013.01); H01L 21/0254 (2013.01); H01L 21/02458 (2013.01); H01L 21/02507 (2013.01); H01L 29/15 (2013.01); H01L 29/205 (2013.01); H01L 29/66522 (2013.01)

(58) Field of Classification Search
CPC . H01L 29/7842; H01L 29/7849; H01L 29/15; H01L 29/205; H01L 29/66522
See application file for complete search history.

(56) References Cited

U.S. PATENT DOCUMENTS

| 2011/0240962 A1 | 10/2011 | Ikuta et al. |
| 2012/0261716 A1 | 10/2012 | Yanagihara |
| 2013/0240949 A1 | 9/2013 | Yamada |
| 2014/0084345 A1 | 3/2014 | Ohki et al. |

Primary Examiner — Joseph C Nicely
Assistant Examiner — Tuan A Hoang
(74) Attorney, Agent, or Firm — Eschweiler & Potashnik, LLC

(57) ABSTRACT

A transistor with a multi-strained layer superlattice (SLS) structure is provided. A first strained layer superlattice (SLS) layer is arranged over a substrate. A first buffer layer is arranged over the first SLS layer and includes dopants configured to increase a resistance of the first buffer layer. A second SLS layer is arranged over the first buffer layer. A second buffer layer is arranged over the second SLS layer and includes dopants configured to increase a resistance of the second buffer layer. A channel layer is arranged over the second buffer layer. An active layer is arranged over and directly abuts the channel layer. The channel and active layers collectively define a heterojunction. A method for manufacturing the transistor is also provided.

20 Claims, 14 Drawing Sheets

SUPERLATTICE BUFFER STRUCTURE FOR GALLIUM NITRIDE TRANSISTORS

BACKGROUND

Semiconductor devices, such as transistors and photodiodes, based on silicon have been the standard for the past three decades. However, semiconductor devices based on alternative materials are receiving increasing attention for advantages over silicon-based semiconductor devices. Semiconductor devices based on gallium nitride (GaN) are one example of such semiconductor devices.

GaN-based semiconductor devices have found widespread use in optoelectric applications (e.g., in light emitting diodes) due to the wide band gap of GaN. GaN-based semiconductor devices also offer a potential advantage for use in solar cells (e.g., where GaN semiconductor devices cover a wide range of photons energies) and in high power applications (e.g., where the high electron mobility and low temperature coefficients of GaN allow it to carry large currents and support high voltages).

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
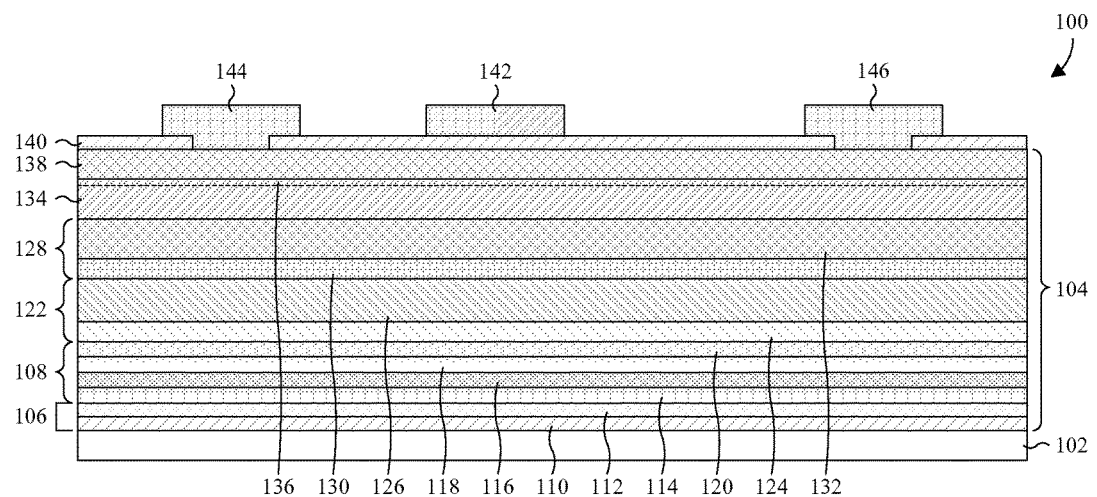
FIG. 1 illustrates a cross-sectional view of some embodiments of a semiconductor structure with a multi-strained layer superlattice (SLS) structure.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some gallium nitride (GaN) transistors include an epitaxial stack arranged over a silicon substrate. The epitaxial stack includes an aluminum nitride (AlN) seed layer, a high resistivity GaN buffer layer, a GaN channel layer, and an $Al_xGa_{1-x}N$ active layer stacked in that order. The GaN channel layer and the $Al_xGa_{1-x}N$ active layer define a heterojunction proximate which a two-dimensional electron gas (2-DEG) forms in the GaN channel layer. The high resistivity GaN buffer layer acts as a "back barrier" for the channel layer to increase the soft breakdown voltage, and includes carbon or iron dopants to achieve high resistivity. For example, the high resistivity GaN buffer can be doped with a carbon concentration greater than about 1e19 $cm^{-3}$, while maintaining the GaN channel layer at a carbon concentration less than about 1e17 $cm^{-3}$.

A challenge with the foregoing semiconductor structure is that the high resistivity GaN buffer layer is grown at a lower pressure and temperature than a normal GaN buffer layer. The lower pressure and temperature lead to poor crystal quality. Further, another challenge with the foregoing semiconductor structure is that carbon or iron dopants used to achieve the high resistivity of the high resistivity GaN buffer layer induce tensile stress. The tensile stress leads to crystalline defects, such as dislocations, proximate the interface between the high resistivity GaN buffer layer and the GaN channel layer. Collectively, the poor crystal quality and the crystalline defects cause wafer cracks and limit the total thickness of the epitaxial stack to less than about 4 micrometers. For example, the GaN channel layer may be limited to a thickness between about 0.2-0.5 micrometers, and the high resistivity GaN buffer layer may be limited to a thickness of between about 0.5-2 micrometers. The limited thickness of the epitaxial stack, in turn, limits the soft breakdown voltage. Further, the poor crystal quality and the crystalline defects cause electron traps, which impact the 2-DEG and device reliability and performance.

Yet another challenge with the foregoing semiconductor structure is that silicon from the silicon substrate diffuses into the high resistivity GaN buffer layer. The diffusing silicon reduces the resistivity of the high resistivity GaN buffer layer, which reduces the soft breakdown voltage. Collectively, the diffusing silicon and the limited group III-V thickness limit the soft breakdown voltage to about 550 volts. Further, the diffusing silicon provides electrons to the electron traps formed by the poor crystal quality and the crystalline defects. Collectively, the diffusing silicon and the electron traps negatively affect the 2-DEG, and therefore impact device reliability and performance. The dynamic on resistance ($R_{on}$) and current collapse are negatively impacted. Further, during high temperature reverse bias (HTRB) tests, the linear region drain current increased by at least about 20 percent.

In view of the foregoing, the present application is directed to an improved GaN transistor with a multi-strained layer supperlattic (SLS) structure, and an improved method for manufacturing the GaN transistor. The improved GaN transistor includes an epitaxial stack having multiple (i.e., at least two) SLS layers stacked between the silicon substrate and the GaN channel layer. The SLS layers may include, for example, AlN/GaN pairs. The SLS layers are paired with corresponding high resistivity GaN buffer layers, and reduce tensile stress caused by the corresponding high resistivity GaN buffer layers. The reduced tensile stress increases device performance and reliability, reduces electron traps, allows increased group III-V thickness, and allows increased soft breakdown voltage.

With reference to FIG. 1, a cross-sectional view 100 of some embodiments of a depletion mode metal-insulation-semiconductor field-effect transistor (D-MISFET) with a multi-SLS structure is provided. The D-MISFET includes a substrate 102 and an epitaxial stack 104 overlying the substrate 102. The substrate 102 typically has crystalline orientation of (111), but other orientations are amenable. Further, the substrate 102 may be, for example, a silicon carbide substrate, a silicon substrate, or a sapphire substrate, and/or may have, for example, a thickness of between about 800-2000 nanometers.

A seed layer 106 of the epitaxial stack 104 is arranged over the substrate 102. The seed layer 106 is employed for growth of a graded buffer layer 108 of the epitaxial stack 104. The seed layer 106 provides a crystalline lattice structure that "seeds" the graded buffer layer 108. Further, in some embodiments, the seed layer 106 is employed to isolate the substrate 102 from an overlying active area of the D-MISFET. The seed layer 106 is typically a group III-V material, such as, for example, aluminum nitride.

In some embodiments, the seed layer 106 includes a first seed layer 110 and a second seed layer 112 arranged over the first seed layer 110. The first and second seed layers 110, 112 are typically the same material, but formed at different temperatures. Further, the second seed layer 112 is typically thicker than the first seed layer 110. For example, the first seed layer 110 may have a thickness of about 20-100 nanometers, and the second seed layer 112 may have a thickness of about 50-200 nanometers.

The graded buffer layer 108 is arranged over the seed layer 106. The graded buffer layer 108 typically has a carbon or iron concentration of greater than about 1e17 cm$^{-3}$, and typically has a thickness of about 0.2-1.5 micrometers. The graded buffer layer 108 includes a plurality of layers 114, 116, 118, 120 with increasing or decreasing amounts of an element common to the layers 114, 116, 118, 120. The relative amounts typically change so as reduce the lattice constants of the layers 114, 116, 118, 120 with distance from the substrate 102. Hence, by "graded", it is meant that the lattice constants and/or doping concentrations change along the thickness of the graded buffer layer 108. The layers may be, for example, a group III-V material.

In some embodiments, the graded buffer layer 108 includes three or four $Al_xGa_{1-x}N$ layers 114, 116, 118, 120 stacked with increasing or decreasing amounts of aluminum and gallium, where x corresponds to an amount of aluminum relative to a combined amount of aluminum and gallium. For example, the graded buffer layer 108 may include an $Al_{0.75}Ga_{0.25}N$ layer 114, an $Al_{0.5}Ga_{0.5}N$ layer 116, and an $Al_{0.25}Ga_{0.25}N$ layer 118 stacked in that order over the seed layer 106. As another example, the graded buffer layer 108 may include an $Al_{0.75}Ga_{0.25}N$ layer 114, an $Al_{0.5}Ga_{0.5}N$ layer 116, an $Al_{0.25}Ga_{0.25}N$ layer 118, and an $Al_{0.1}Ga_{0.9}N$ layer 120 stacked in that order over the seed layer 106.

One or more first SLS/high resistivity pairs 122 of the epitaxial stack 104 are stacked over the graded buffer layer 108. In some embodiments, the one or more first SLS/high resistivity pairs 122 include between about 1 and about 20 first pairs. Each of the first SLS/high resistivity pair 122 typically includes a first SLS layer 124 and a first high resistivity buffer layer 126 arranged over the first SLS layer 124.

The first SLS layer 124 typically has a carbon or iron concentration greater than about 5e19 cm$^{-3}$, and typically has a thickness of about 10-30 nanometers. The first SLS layer 124 includes a plurality of pairs of lattice mismatched layers, typically about 20-100 pairs. A pair of lattice mismatched layers includes a pair of layers, typically group III-V layers, with different lattice constants that collectively produce a compressive force. In some embodiments, a pair of lattice mismatched layers includes a GaN layer and an AlN layer overlying the GaN layer. The GaN layer has a lattice constant of about 3.189, and the AlN layer has a lattice constant of about 3.11. The GaN layer produces a compressive force that exceeds a tensile force produced by the AlN layer, whereby the collective force produced by the pair is compressive. In other embodiments, a pair of lattice mismatched layers includes an $Al_xGa_{1-x}N$ layer and an $Al_yGa_{1-y}N$ layer, where x is about 0.6-1.0 and y is about 0.0-0.4.

The first high resistivity buffer layer 126 is typically a doped GaN layer, but other doped group III-V layers are amenable. In some embodiments, the dopants are carbon or iron, and/or have a concentration of exceeding about 1e19 cm$^{-3}$. The dopants produce the high resistivity, and induce a tensile force. Typically, the first high resistivity buffer layer 126 is doped so the tensile force is comparable to the compressive force produced by the first SLS layer 124, whereby the forces approximately cancel each other out. The first high resistivity buffer layer 126 may have a thickness of, for example, about 0.1-1.5 micrometers.

A second SLS/high resistivity pair 128 of the epitaxial stack 104 is arranged over the one or more first SLS/high resistivity pairs 122. The second SLS/high resistivity pair 128 includes a second SLS layer 130 and a second high resistivity buffer layer 132 arranged over the second SLS layer 130. In other embodiments, additional second SLS/high resistivity pairs are arranged over the one or more first SLS/high resistivity pairs 122.

The second SLS layer 130 typically has a carbon or iron concentration greater than about 5e19 cm$^{-3}$, and typically has a thickness of about 10-30 nanometers. The second SLS layer 130 includes a plurality of pairs of lattice mismatched layers, typically about 20-100 pairs. A pair of lattice mismatched layers includes a pair of layers with different lattice constants that collectively produce a compressive force. For example, a pair of lattice mismatched layers may include a GaN layer and an AlN layer. As another example, a pair of lattice mismatched layers may include an $Al_xGa_{1-x}N$ layer and an $Al_yGa_{1-y}N$ layer, where x is about 0.6-1.0 and y is about 0.0-0.4.

The second high resistivity buffer layer 132 is typically a doped GaN layer, but other doped group III-V layers are amenable. In some embodiments, the dopants are carbon or iron, and/or have a concentration of exceeding about 1e19 cm$^{-3}$. The dopants produce the high resistivity, and induce a tensile force. Typically, the second high resistivity buffer layer 132 is doped so the tensile force is comparable to the compressive force produced by the second SLS layer 130, whereby the forces approximately cancel each other out. The second high resistivity buffer layer 132 may have a thickness of, for example, about 0.5-2.0 micrometers, which is typically thicker than the first high resistivity buffer layer 126.

A channel layer 134 of the epitaxial stack 104 is arranged over the second high resistivity buffer layer 132. The channel layer 134 includes a 2-DEG 136 (demarcated by the dashed line), within which a conductive channel is selectively formed. The 2-DEG 136 has high mobility electrons that are not bound to any atoms and that are free to move within the 2-DEG 136. The channel layer 134 is typically undoped GaN, but other group III-V materials are amenable. For example, the channel layer 134 may, for example, be indium gallium nitride (InGaN). The channel layer 134 may have a thickness of, for example, about 0.2-1.0 micrometers.

An active layer 138 of the epitaxial stack 104 is arranged directly on top of the channel layer 134, such that the top surface of the channel layer 134 and the bottom surface of the active layer 138 directly abut each other. The active layer 138 includes a material, typically a group III-V material, having a band gap unequal to that of the channel layer 134. For example, where the channel layer 134 is GaN, the active layer 138 may be AlGaN. AlGaN has a band gap of approximately 4 electron volts (eV), whereas GaN has a band gap of approximately 3.4 eV. By way of the unequal band gaps, the active layer 138 and the channel layer 134 collectively define a heterojunction proximate which the 2-DEG 136. The heterojunction allows the active layer 138 to selectively provide or remove electrons to or from the 2-DEG 136. With a high concentration of electrons from the active layer 138, the 2-DEG 136 conducts.

In some embodiments, the active layer 138 is limited to a single layer of AlGaN, typically having a thickness of about 10-30 nanometers. In other embodiments, the active layer 138 includes three layers. For example, the three layers may include: 1) an AlN layer of, for example, about 0.2-1.5 nanometers thick; 2) an AlGaN layer of, for example, about 10-30 nanometers thick; and 3) an undoped GaN layer of, for example, about 2-20 nanometers thick.

A dielectric layer 140 is arranged over the active layer 138, and a gate electrode 142 and source/drain electrodes 144, 146 are arranged over the dielectric layer 140. The dielectric layer 140 may be, for example, an oxide, such as silicon dioxide, or a nitride, such as silicon nitride. The source/drain electrodes 144, 146 are arranged on opposing sides of the gate electrode 142. Further, the source/drain electrodes 144, 146 extend through the dielectric layer 140 to the active layer 138. The gate electrode 142 and the source/drain electrodes 144, 146 may be a conductive material, such as metal or doped polysilicon.

Advantageously, the SLS layers 124, 130 underlying the high resistivity buffer layers 126, 132 counteract the tensile stress produced by the high resistivity buffer layers 126, 132. The reduced stress allows the thickness of the epitaxial stack 104 to be increased, while reducing the size of cracks that form during bulk manufacture. For example, using the epitaxial stack 104, a crack size of 5.5 millimeters resulted with an epitaxial thickness of 4.87 micrometers. In contrast, using the traditional epitaxial stack, a crack size of greater than 10 millimeters results with an epitaxial thickness of 3.7 micrometers. Further, the reduced tensile stress reduces electron traps, improves device performance and reliability, and allows the soft breakdown voltage to be increased. During testing, a soft breakdown voltage of approximately 650 volts was achieved using the SLS layers 124, 130, which is to be contrasted with approximately 550 volts achieved without the SLS layers 124, 130.

In addition to reducing stress, the SLS layers 124, 130 may also improve device reliability and performance by trapping electrons diffusing from the substrate 102 towards the channel layer 134. For example, by trapping electrons, the SLS layers 124, 130 improve the $R_{on}$ and current collapse, and reduce the linear region drain current during HTRB testing. In some embodiments, the SLS layers 124, 130 may include quantum dots (e.g., GaN quantum dots, Si quantum dots, etc.) configured to trap electrons moving towards the channel layer 134. For example, where the substrate 102 is silicon, the quantum dots within the SLS layers 124, 130 may trap electrons diffusing from the substrate 102 towards the channel layer 134.

Figure 2:
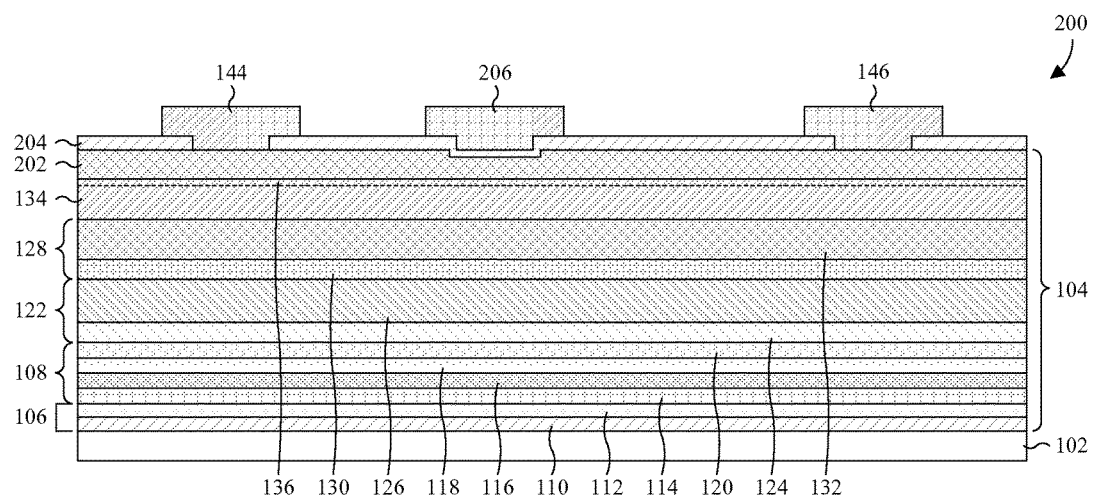
FIG. 2 illustrates a cross-sectional view of other embodiments of a semiconductor structure with a multi-SLS structure.

With reference to FIG. 2, a cross-sectional view 200 of some embodiments of an enhancement mode metal-insulation-semiconductor field-effect transistor (E-MISFET) with a multi-SLS structure is provided. The E-MISFET includes a similar structure as the D-MISFET of FIG. 1, except it includes a different active layer structure and a different gate structure. An active layer 202 is arranged over the channel layer 134. The active layer 202 may include one or more group III-V materials, and is typically a single layer of AlGaN or a multilayer stack of AlN and AlGaN. A dielectric layer 204 is arranged over the active layer 202 and extends into the active layer 138 over a gate region. The dielectric layer 204 may be, for example, an oxide, such as silicon dioxide, or a nitride, such as silicon nitride. A gate electrode 206 is arranged over the dielectric layer 204 and extends into the dielectric layer 204 to approximately even with a top surface of the active layer 202. The gate electrode 206 may be, for example, a conductive material, such as metal or doped polysilicon.

Figure 3:
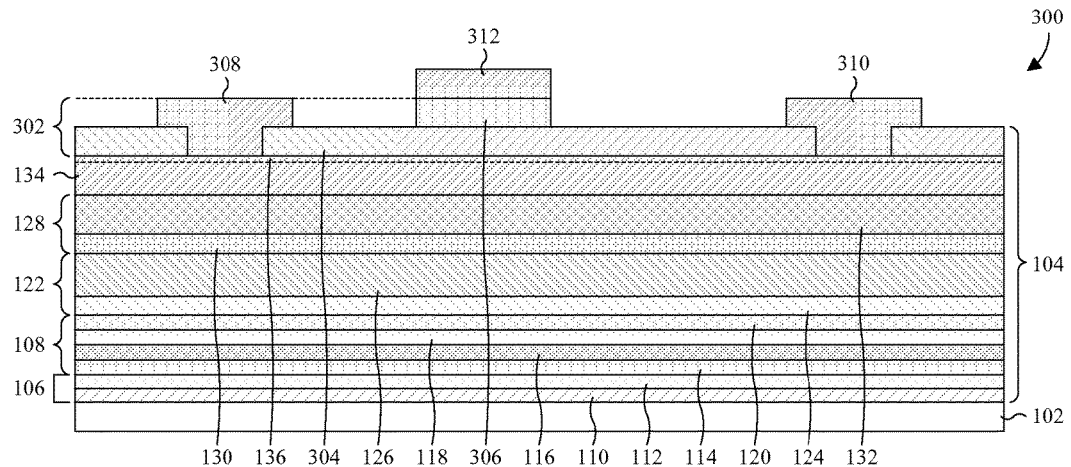
FIG. 3 illustrates a cross-sectional view of yet other embodiments of a semiconductor structure with a multi-SLS structure.

With reference to FIG. 3, a cross-sectional view 300 of some embodiments of an enhancement mode high-electron-mobility transistor (E-HEMT) with a multi-SLS structure is provided. The E-HEMT includes a similar structure as the D-MISFET of FIG. 1, except it includes a different active layer structure and different gate and source/drain structures. An active layer 302 includes a bottom active layer 304 arranged over the channel layer 134 and a top active layer 306 arranged over a gate region of the bottom active layer 304.

The bottom active layer 304 may include a single group III-V layer, such as, for example, an AlGaN layer. The AlGaN layer may be, for example, about 0.2-1.5 nanometers thick. Alternatively, the bottom active layer 304 may be a multilayer stack of group III-V layers. For example, the bottom active layer 304 may include an AlN layer and an overlying AlGaN layer. The AlN layer may have a thickness of, for example, about 0.2-1.5 nanometers, and/or the AlGaN layer may have a thickness of, for example, about 10-30 nanometers.

The top active layer 306 may include, for example, a single p- or n-type group III-V layer, such as a p- or n-type GaN layer. The p- or n-type GaN layer may, for example, have a thickness of about 10-200 nanometers thick. Alternatively, the top active layer 306 may be a multilayer stack of doped group III-V layers. For example, the top active layer 306 may include a p-type GaN layer and an n-type GaN layer over the p-type GaN layer. The p-type GaN layer may, for example, have a thickness of about 10-200 nanometers, and/or include, for example, magnesium dopants with a concentration of about $8e18$ $cm^{-3}$ to about $3e19$ $cm^{-3}$. The n-type GaN layer may, for example, have a thickness of about 10-200 nanometers, and/or include, for example, silicon dopants with a concentration of about $5e15$ $cm^{-3}$ to about $1e17$ $cm^{-3}$.

Source/drain electrodes 308, 310 are arranged over the bottom active layer 304 and extend into the bottom active layer 304 or into the channel layer 134. Further, a gate electrode 312 is arranged over the top active layer 306 and spaced from the bottom active layer 304 by the top active layer 306. The source/drain and gate electrodes 308, 310, 312 may be, for example, a conductive material, such as metal or doped polysilicon.

Figure 4:
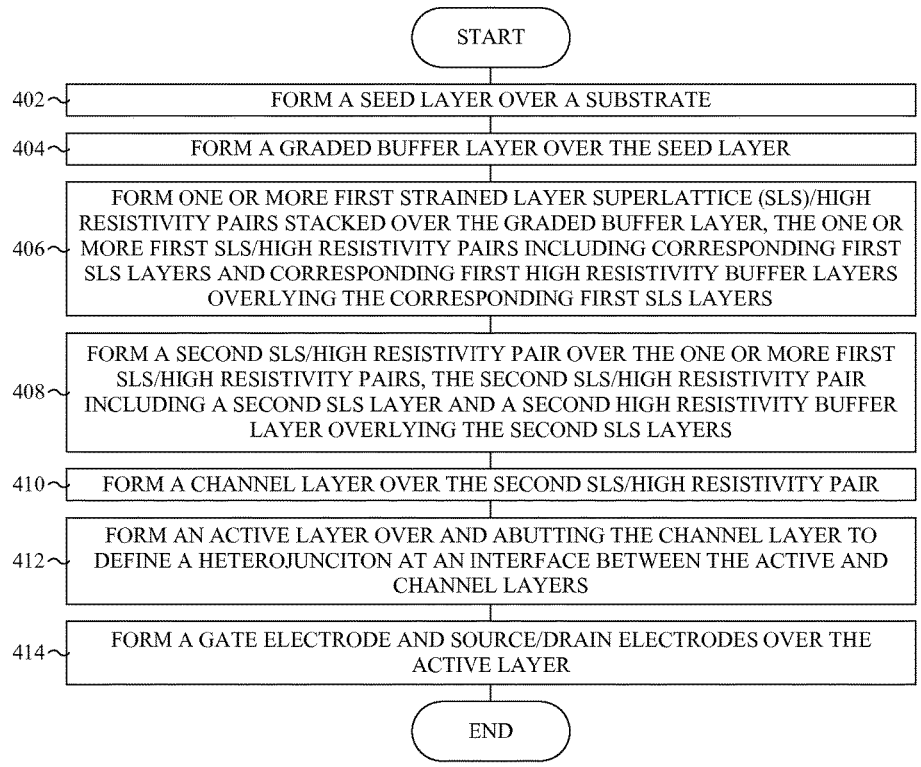
FIG. 4 illustrates a flowchart of some embodiments of a method for manufacturing a semiconductor structure with a multi-SLS structure.

With reference to FIG. 4, a flowchart 400 of some embodiments of a method for manufacturing a GaN transistor with a multi-SLS structure is provided. The GaN transistor may be, for example, an E-MISFET, a D-MISFET, or an E-HEMT.

At 402, a seed layer is formed over a substrate.

At 404, a graded buffer layer is formed over the seed layer.

At 406, one or more first SLS/high resistivity pairs are formed stacked over the graded buffer layer. The one or more first SLS/high resistivity pairs each include a first SLS layer and a first high resistivity buffer layer overlying the first SLS layer.

At 408, a second SLS/high resistivity pair is formed over the one or more first SLS/high resistivity pairs. The second SLS/high resistivity pair includes a second SLS layer and a second high resistivity buffer layer overlying the second SLS layer.

At 410, a channel layer is formed over the second high resistivity buffer layer.

At 412, an active layer is formed over the channel layer to define a heterojunction at an interface between the active and channel layers.

At 414, a gate electrode and source/drain electrodes are formed over the active layer.

Advantageously, the multi-SLS structure reduces tensile stress. The reduced tensile stress increases device performance and reliability, reduces electron traps, allows increased epitaxial thickness, and allows increased soft breakdown voltage.

While the method described by the flowchart 400 is illustrated and described herein as a series of acts or events, it will be appreciated that the illustrated ordering of such acts or events are not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

With reference to FIGS. 5-15, 16A-D, 17A-E, and 18A-E, cross-sectional views of some embodiments of a GaN transistor with a multi-SLS structure at various stages of manufacture are provided to illustrate the method of FIG. 4. Although FIGS. 5-15, 16A-D, 17A-E, and 18A-F are described in relation to the method, it will be appreciated that the structures disclosed in FIGS. 5-15, 16A-D, 17A-E, and 18A-F are not limited to the method, but instead may stand alone as structures independent of the method. Similarly, although the method is described in relation to FIGS. 5-15, 16A-D, 17A-E, and 18A-F, it will be appreciated that the method is not limited to the structures disclosed in FIGS. 5-15, 16A-D, 17A-E, and 18A-F, but instead may stand alone independent of the structures disclosed in FIGS. 5-15, 16A-D, 17A-E, and 18A-F.

Figure 5:
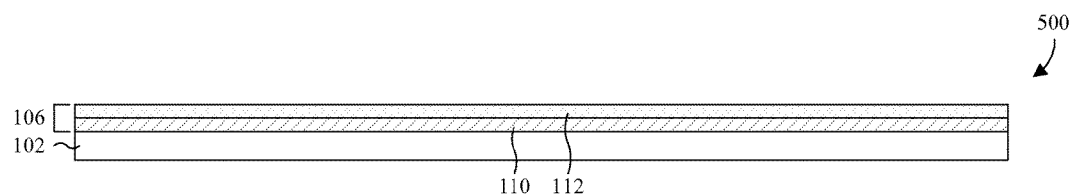
FIGS. 5-15, 16A-D, 17A-E, and 18A-F illustrate a series of cross-sectional views of some embodiments of a semiconductor structure at various stages of manufacture, the semiconductor structure having a multi-SLS structure.

FIG. 5 illustrates a cross-sectional view 500 of some embodiments corresponding to Act 402.

As illustrated by FIG. 5, a substrate 102 is provided. The substrate 102 typically has crystalline orientation of (111), but other orientations are amenable. Further, the substrate 102 may be, for example, a silicon carbide substrate, a silicon substrate, or a sapphire substrate, and/or may have, for example, a thickness of between about 800-2000 nanometers. Also illustrated, a seed layer 106 is formed over the substrate 102. The seed layer 106 is employed for growth of a subsequently formed layer, discussed hereafter, and a group III-V material, such as aluminum nitride. The seed layer 106 can be formed using any suitable deposition technique, such as metal-organic chemical vapor deposition (MOCVD).

In some embodiments, the process for forming the seed layer 106 includes: forming a first seed layer 110 over the substrate 102; and forming a second seed layer 112 arranged over the first seed layer 110. The first and second seed layers 110, 112 are typically formed of the same material, such as aluminum nitride, but at different temperatures. For example, the first seed layer 110 may be formed at about 900-1000 degrees Celsius, whereas the second seed layer 112 may be formed at about 1050-1200 degrees Celsius. Further, the first seed layer 110 may be, for example, formed with a thickness of about 20-100 nanometers, and the second seed layer 112 may be, for example, formed with a thickness of about 50-200 nanometers.

Figure 6:
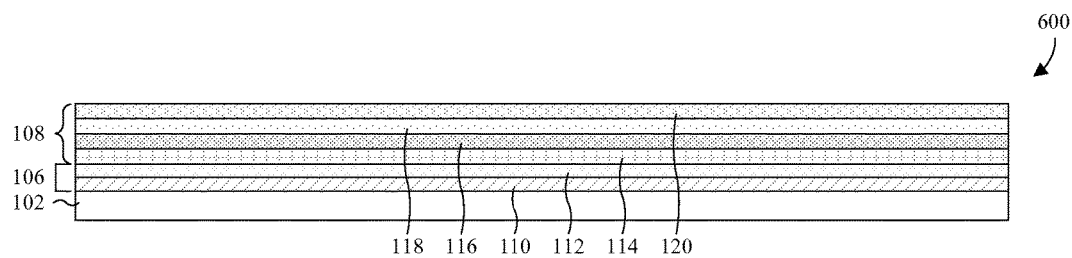

FIG. 6 illustrates a cross-sectional view 600 of some embodiments corresponding to Act 404.

As illustrated by FIG. 6, a graded buffer layer 108 is formed over the seed layer 106. The graded buffer layer 108 includes one or more layers 114, 116, 118, 120, typically group III-V layers, with increasing or decreasing amounts of at least one element common to the layers 114, 116, 118, 120. For example, the graded buffer layer 108 typically includes three or four layers 114, 116, 118, 120 of $Al_xGa_{1-x}N$ stacked with decreasing amounts of aluminum, and increasing amounts of gallium, away from the substrate 102, where x corresponds to the amount of aluminum relative to the total amount of aluminum and gallium. The amounts change so as reduce the lattice constants of the layers 114, 116, 118, 120 with distance from the substrate 102.

The process for forming the graded buffer layer 108 may include sequentially forming the one or more layers 114, 116, 118, 120 stacked upon each other. The layers 114, 116, 118, 120 may be formed using any suitable deposition technique, such as MOCVD, molecular beam epitaxy (MBE), or hydride vapor phase epitaxy (HVPE). The layers 114, 116, 118, 120 are typically formed with a carbon concentration of greater than about 1e17 $cm^{-3}$. Further, the layers 114, 116, 118, 120 are typically formed at a temperature of about 980-1150 degrees Celsius, and/or with a thickness of about 0.2-1.5 micrometers.

Figure 7:
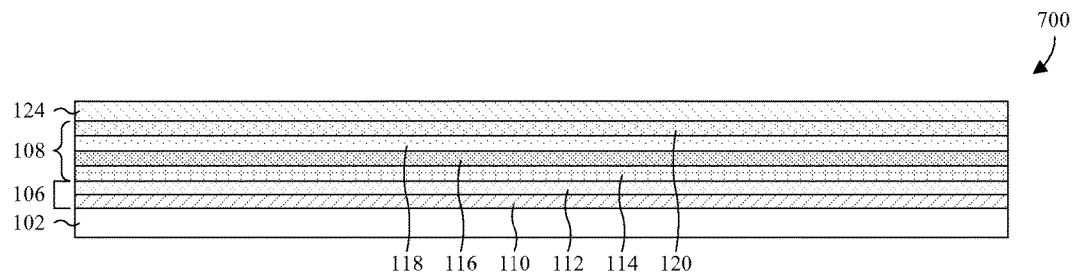
Figure 8:
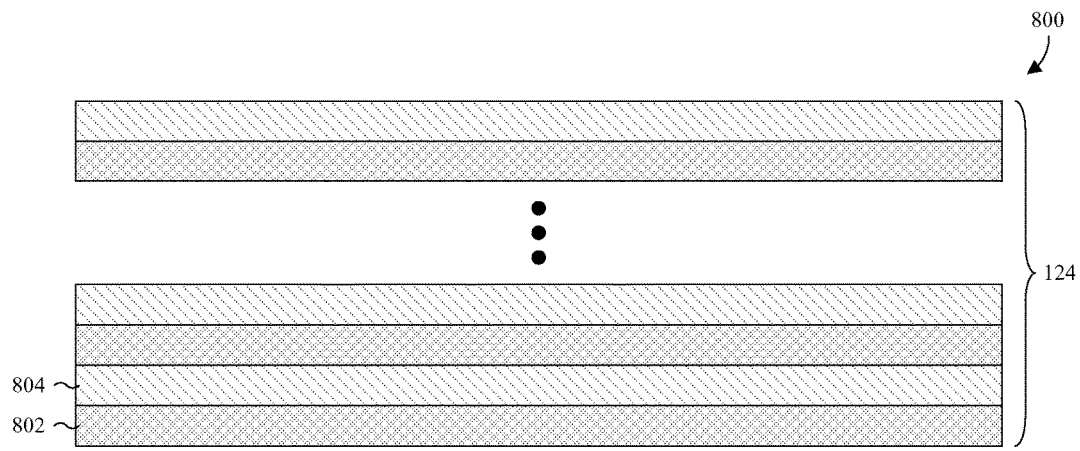
Figure 9:
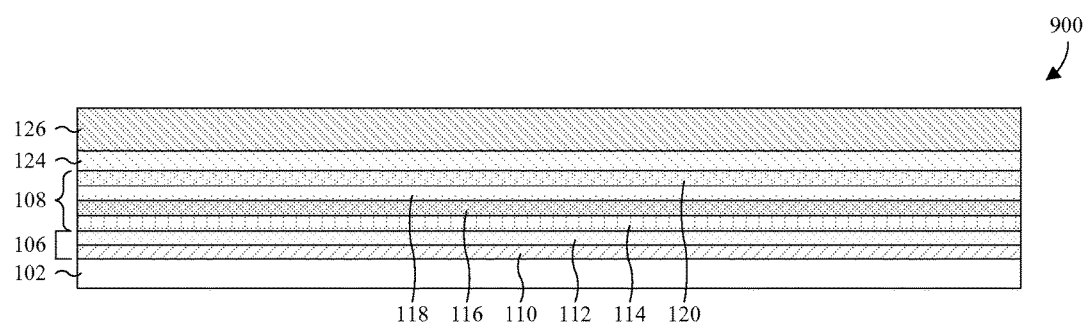

FIGS. 7-9 illustrate cross-sectional views 700, 800, 900 of some embodiments corresponding to Act 406.

As illustrated by FIG. 7, a first SLS layer 124 is formed over the graded buffer layer 108. The first SLS layer 124 includes a plurality of pairs of lattice mismatched layers, typically about 20-100 pairs. A pair of lattice mismatched layers, typically each pair of lattice mismatched layers, includes a pair of layers with different lattice constants that collectively produce a compressive force. In some embodiments, the pair of layers is a pair of group III-V layers. For example, the pair of layers may be a GaN layer and an AlN layer overlying the GaN layer. As another example, the pair of layers may be an $Al_xGa_{1-x}N$ layer and an $Al_yGa_{1-y}N$ layer, where x is about 0.6-1.0 and y is about 0.0-0.4.

As illustrated by FIG. 8, the process for forming the first SLS layer 124 typically includes alternatingly forming lattice mismatched layers 802, 804. The lattice mismatched layers 802, 804 typically include layers of AlN and GaN. Lattice mismatched layers 802 of AlN may be formed, for example, with a thickness of about 2-8 nanometers, and lattice mismatched layers 804 of GaN may be formed, for example, with a thickness of about 10-30 nanometers. The lattice mismatched layers 802, 804 may be formed using any suitable deposition technique, such as MOCVD, MBE, or HVPE, and are typically formed with a carbon concentration of greater than about 5e17 cm$^{-3}$. Further, the lattice mismatched layers 802, 804 are typically formed at a temperature of about 900-1150 degrees Celsius.

As illustrated by FIG. 9, a first high resistivity buffer layer 126 is formed over the first SLS layer 124. The first high resistivity buffer layer 126 is a group III-V layer with dopants to increase the resistance. For example, the first high resistivity buffer layer 126 is typically a GaN layer doped with carbon or iron.

The process for forming the first high resistivity buffer layer 126 may include, for example, forming a group III-V layer over the first SLS layer 124 and subsequently doping the epitaxial layer with dopants. The group III-V layer may be formed using any suitable deposition technique, such as MOCVD, MBE, or HVPE, and is typically formed about 950-1050 degrees Celsius. Further, the group III-V layer is typically doped with a carbon or iron concentration of greater than about 1e19 cm$^{-3}$.

While not necessarily, in some embodiments, the first SLS layer 124 and the first high resistivity buffer layer 126 are alternatingly formed stacked over each other several more times. For example, the first SLS layer 124 and the first high resistivity buffer layer 126 may be repeated about 2-19 more times.

Figure 10:
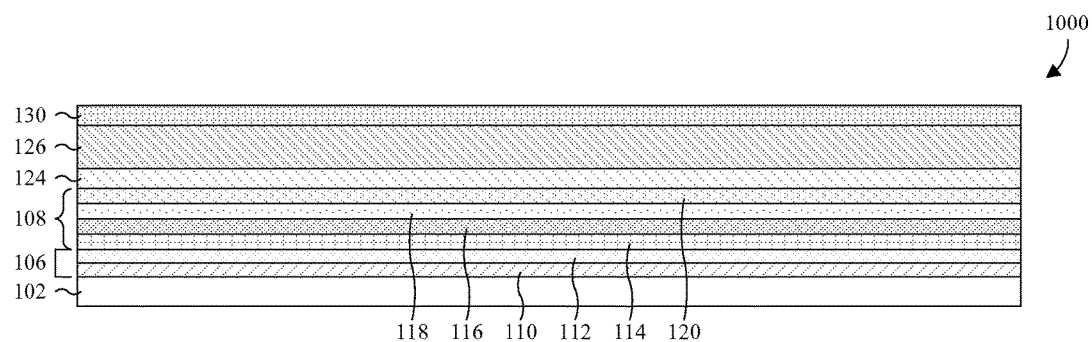
Figure 11:
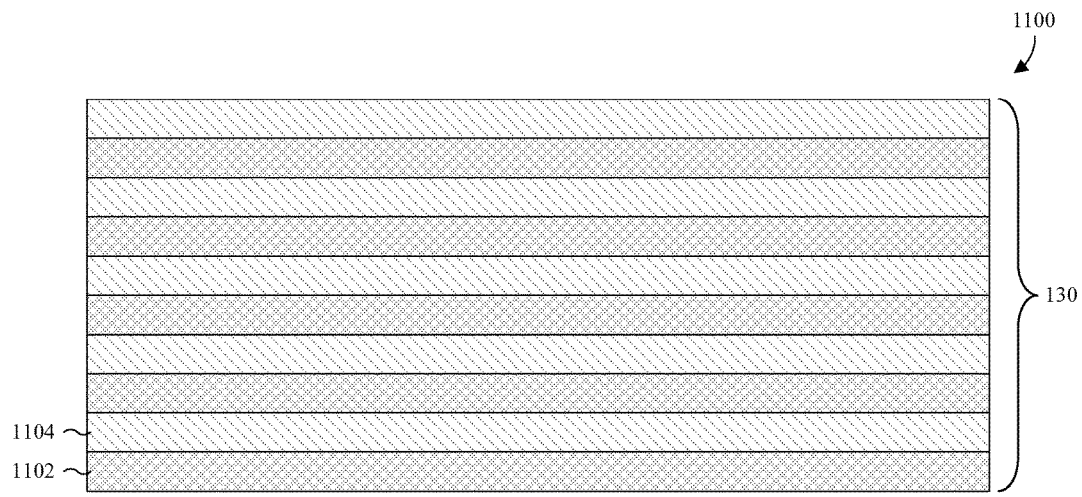
Figure 12:
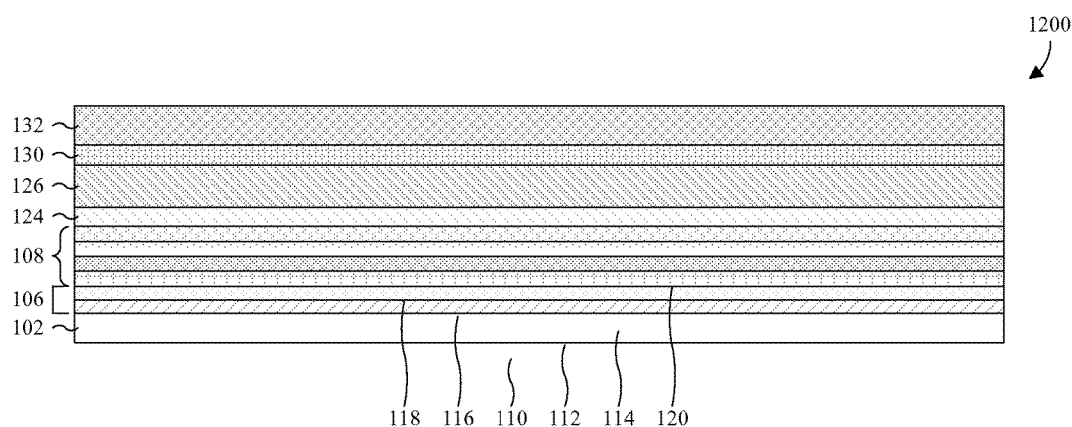

FIGS. 10-12 illustrate cross-sectional views 1000, 1100, 1200 of some embodiments corresponding to Act 408.

As illustrated by FIG. 10, a second SLS layer 130 is formed over the first high resistivity buffer layer 126. The second SLS layer 130 includes a plurality of pairs of lattice mismatched layers, typically about 20-100 pairs. A pair of lattice mismatched layers, typically each pair of lattice mismatched layers, includes a pair of layers with different lattice constants that collectively produce a compressive force. In some embodiments, the pair of layers is a pair of group III-V layers. For example, the pair of layers may be a GaN layer and an AlN layer overlying the GaN layer. As another example, the pair of layers may be an $Al_xGa_{1-x}N$ layer and an $Al_yGa_{1-y}N$ layer, where x is about 0.6-1.0 and y is about 0.0-0.4.

As illustrated by FIG. 11, the process for forming the second SLS layer 130 typically includes alternatingly forming lattice mismatched layers 1102, 1104. The lattice mismatched layers 1102, 1104 typically include layers of AlN and GaN. Lattice mismatched layers 1102 of AlN may be formed, for example, with a thickness of about 2-8 nanometers, and lattice mismatched layers 1104 of GaN may be formed, for example, with a thickness of about 10-30 nanometers. The lattice mismatched layers 1102, 1104 may be formed using any suitable deposition technique, such as MOCVD, MBE, or HVPE, and are typically formed with a carbon concentration of greater than about 5e17 cm$^{-3}$. Further, the lattice mismatched layers 1102, 1104 are typically formed at a temperature of about 900-1150 degrees Celsius.

As illustrated by FIG. 12, a second high resistivity buffer layer 132 is formed over the second SLS layer 130. The second high resistivity buffer layer 132 is a group III-V layer with dopants to increase the resistance. For example, the second high resistivity buffer layer 132 is typically a GaN layer doped with carbon or iron.

The process for forming the second high resistivity buffer layer 132 may include, for example, forming a group III-V layer over the second SLS layer 130 and subsequently doping the group III-V layer with dopants. The group III-V layer may be formed using any suitable deposition technique, such as MOCVD, MBE, or HVPE, and is typically formed about 950-1050 degrees Celsius. Further, the group III-V layer is typically doped with a carbon or iron concentration of greater than about 1e19 cm$^{-3}$.

Figure 13:
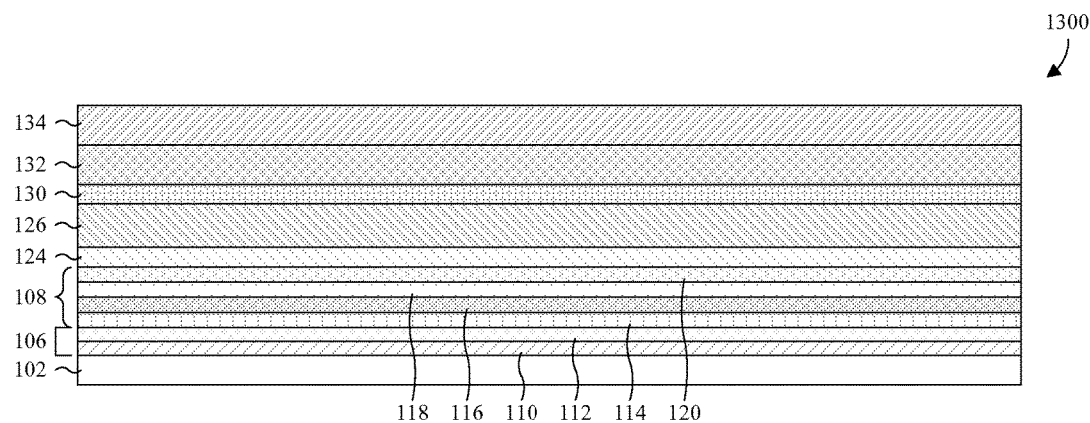

FIG. 13 illustrates a cross-sectional view 1300 of some embodiments corresponding to Act 410.

As illustrated by FIG. 13, a channel layer 134 is formed over the second high resistivity buffer layer 132. The channel layer 134 is typically an undoped group III-V layer, such as undoped GaN layer. Further, to the extent that the channel layer 134 includes dopants, the channel layer 134 typically has a concentration of dopants, such as carbon or iron, less than about 1e17 cm$^{-3}$. The channel layer 134 may be formed using any suitable deposition technique, such as MOCVD, MBE, or HVPE, and is typically formed at about 905-1050 degrees Celsius. Further, the channel layer 134 is typically formed with a thickness of about 0.2-1.0 micrometers.

Figure 14:
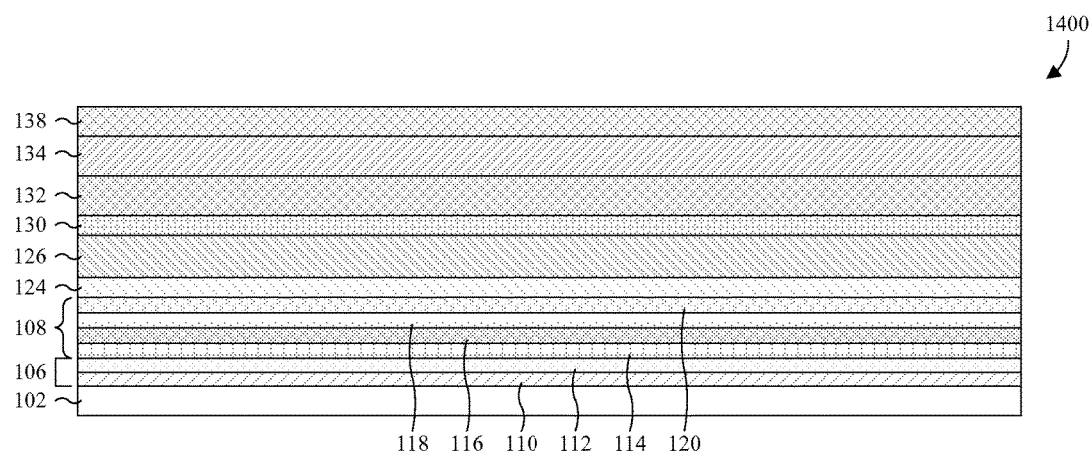
Figure 15:
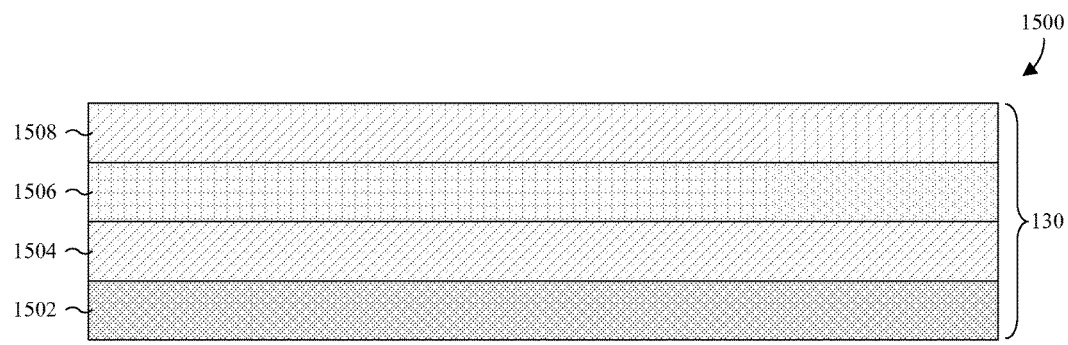

FIGS. 14 and 15 illustrate cross-sectional views 1400, 1500 of some embodiments corresponding to Act 412.

As illustrated by FIG. 14, an active layer 138 is formed over the channel layer 134 to define a heterojunction at an interface between the active layer 138 and the channel layer 134. In some embodiments, the process for forming the active layer 138 includes forming a single group III-V layer over the channel layer 134. The single group III-V layer may be, for example, an AlGaN layer, typically having a thickness of about 10-30 nanometers. The single group III-V layer may be formed using any suitable deposition technique, such as MOCVD, MBE, or HVPE, and is typically formed at a temperature of about 1000-1150 degrees Celsius. Alternatively, the process for forming the active layer 138 may include forming a multilayer stack of group III-V layers, typically including AlN, AlGaN, and/or GaN.

As illustrated by FIG. 15, the active layer 138 is formed over the channel layer 134 as a multilayer stack. A series of channel layers 1502, 1504, 1506, 1508 are sequentially formed stacked over each other using any suitable deposition technique, such as MOCVD, MBE, or HVPE. In some embodiment, the process for forming the multilayer stack includes sequentially forming an AlN layer 1502, an AlGaN layer 1504, and a GaN layer 1506. The AlN layer 1502 is typically formed with a thickness of 0.2-1.5 nanometers, and the AlGaN layer 1504 is typically formed with a thickness of about 10-30 nanometers. The GaN layer 1506 may be undoped or doped with p- or n-type dopants. Where undoped, the GaN layer 1506 is typically about 2-20 nanometers thick. Where doped, the GaN layer 1506 is typically about 10-200 nanometers thick and/or typically doped with a p-type magnesium dopants to a concentration of about 8e18 cm$^{-3}$ to about 3e19 cm$^{-3}$. In other embodiments, the process for forming the multilayer stack includes sequentially forming an AlN layer 1502, an AlGaN layer 1504, a p-type GaN layer 1506, and an n-type GaN layer 1508. The p- and n-type GaN layers 1506, 1508 are typically about 10-200 nanometers thick, and/or typically doped with magnesium and/or silicon. For example, the p-type GaN layer 1506 is typically doped with a magnesium concentration of about 8e18 cm$^{-3}$ to about 3e19 cm$^{-3}$, and the n-type GaN layer 1508 is typically doped with a silicon concentration of about 5e15 cm$^{-3}$ to about 1e17 cm$^{-3}$.

FIGS. 16A-D illustrate cross-sectional views 1600A-D of some embodiments corresponding to Act 414, which may be used to form an D-MISFET (e.g., as shown by one example in FIG. 1). In these embodiments, the active layer 138 is typically a single AlGaN layer or a three-layer stack comprising an AlN layer, an AlGaN layer, and an undoped GaN layer.

Figure 16A:
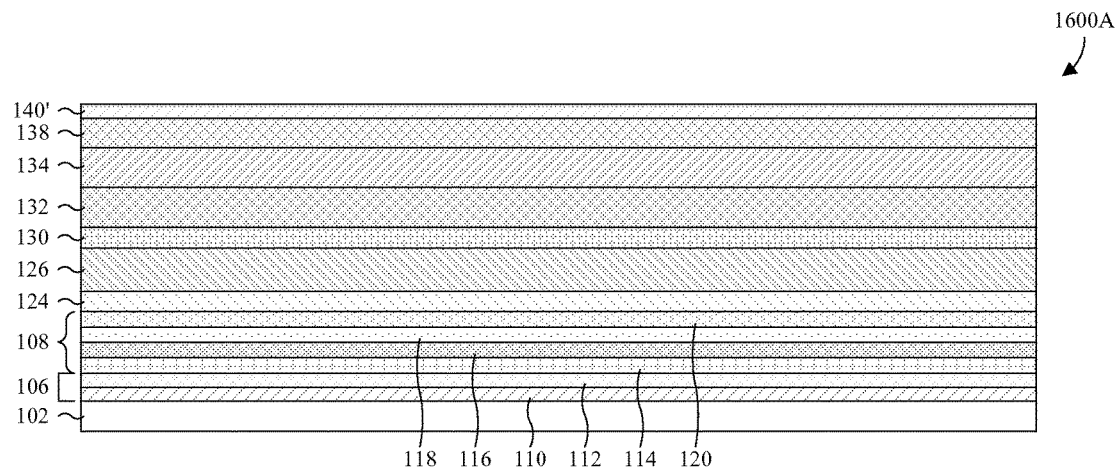

As illustrated by FIG. 16A, a dielectric layer 140' is formed over the active layer 138. The dielectric layer 140' may be formed using any suitable deposition technique, such as chemical vapor deposition (CVD) or physical vapor deposition (PVD). The dielectric layer 140' may be formed as, for example, an oxide, such as silicon dioxide.

Figure 16B:
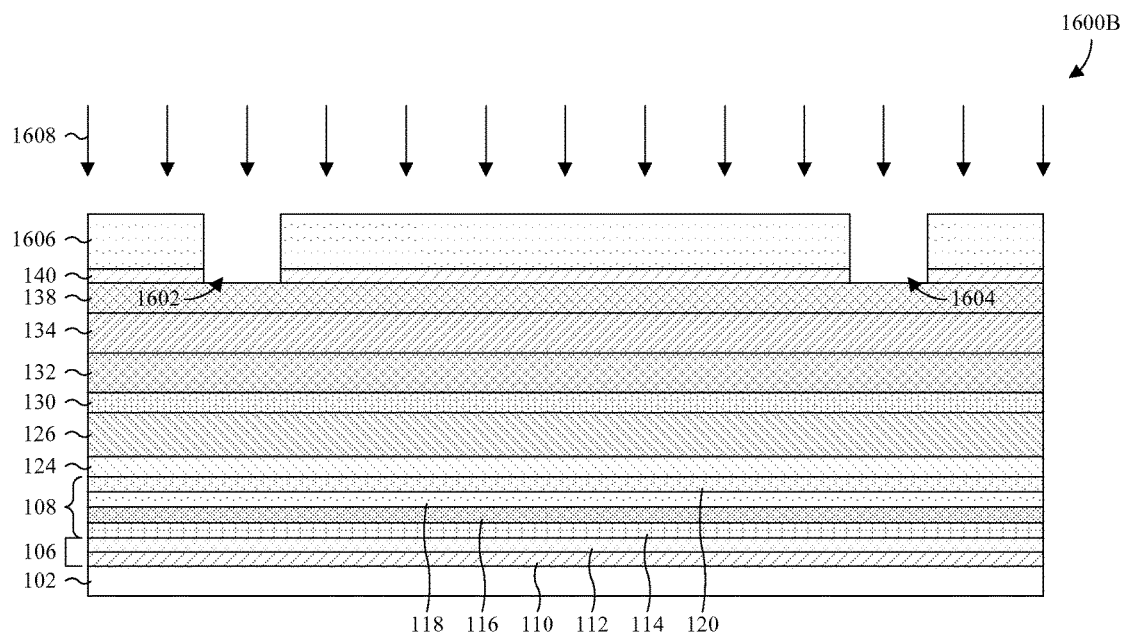

As illustrated by FIG. 16B, a first etch is performed to the active layer 138, through regions of the dielectric layer 140' overlying source/drain regions. The first etch results in source/drain openings 1602, 1604 in the remaining dielectric layer 140. In some embodiments, the process for performing the first etch includes: forming a photoresist layer 1606 masking regions of the dielectric layer 140' surrounding the source/drain regions; applying an etchant 1608 according to the photoresist layer 1606, which is preferential of the dielectric layer 140' relative to the active layer 138; and removing the photoresist layer 1606.

Figure 16C:
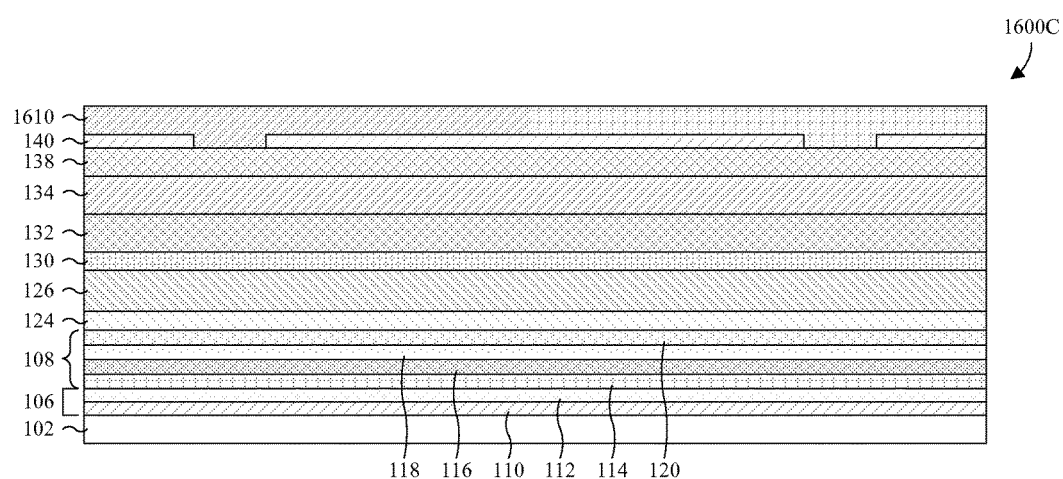

As illustrated by FIG. 16C, a conductive layer 1610 is formed over the remaining dielectric layer 140 and filling the source/drain openings 1602, 1604. The conductive layer 1610 may be, for example, a metal, such as copper, or doped polysilicon.

Figure 16D:
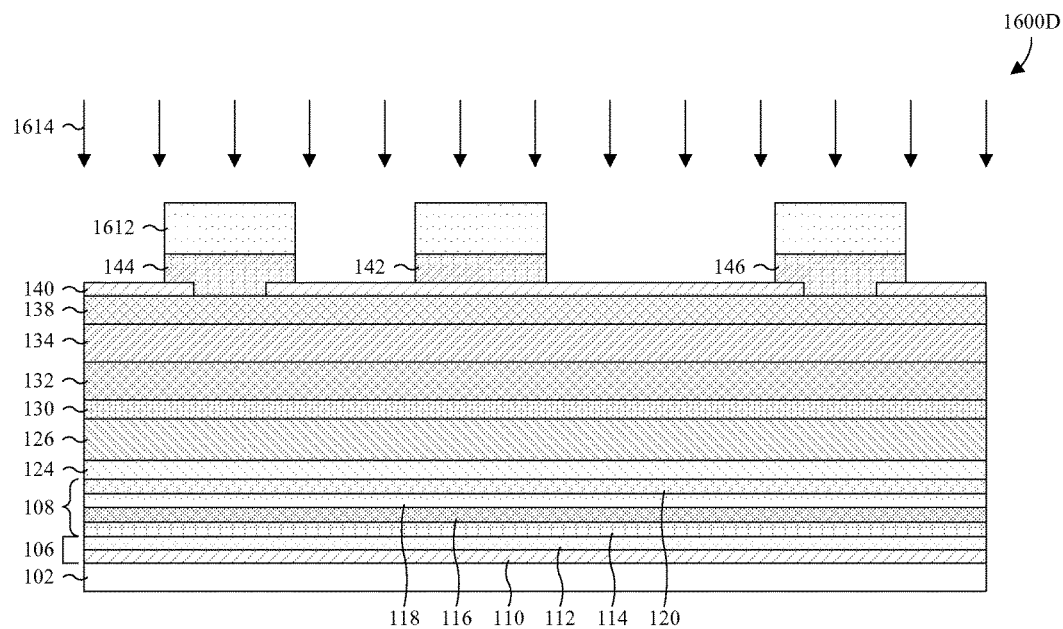

As illustrated by FIG. 16D, a second etch is performed to the remaining dielectric layer 140, through regions of the conductive layer 1610 surrounding source/drain and gate regions. The second etch results in source/drain electrodes 144, 146 and a gate electrode 142. In some embodiments, the process for performing the second etch includes: forming a photoresist layer 1612 masking regions of the remaining dielectric layer 140 surrounding the source/drain and gate regions; applying an etchant 1614 according to the photoresist layer 1612, which is preferential of the conductive layer 1610 relative to the remaining dielectric layer 140; and removing the photoresist layer 1612.

FIGS. 17A-E illustrate cross-sectional views 1700A-E of other embodiments corresponding to Act 414, which may be used to form an E-MISFET (e.g., as shown by one example in FIG. 2). In these embodiments, the active layer 138 is typically a single AlGaN layer or a three-layer stack comprising an AlN layer, an AlGaN layer, and an undoped GaN layer.

Figure 17A:
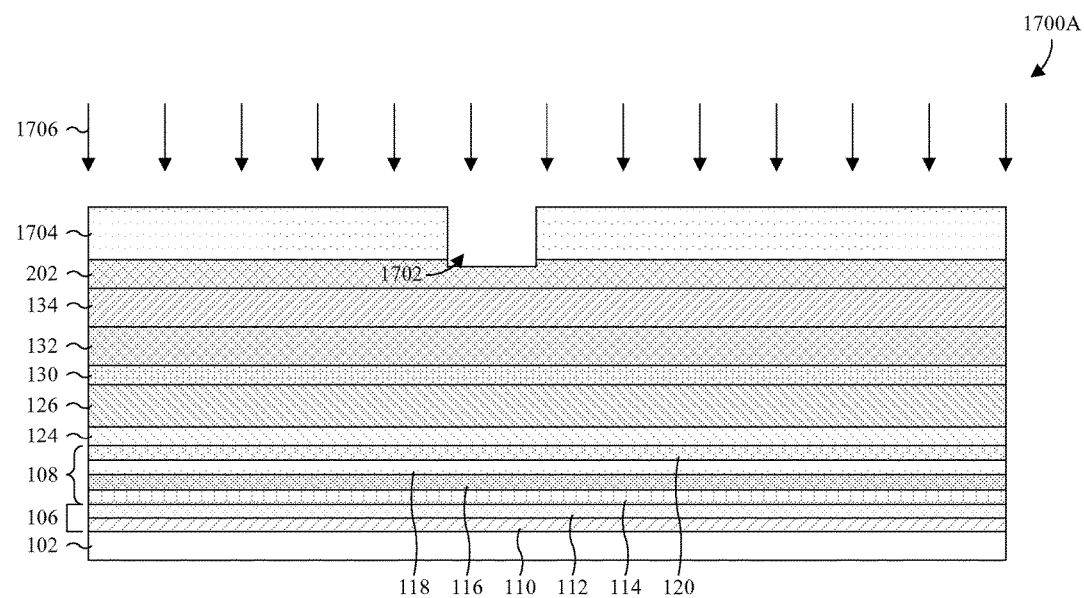

As illustrated by FIG. 17A, a first etch is performed into a gate region of the active layer 138, resulting in a first gate opening 1702 in the remaining active layer 202. In some embodiments, the process for performing the first etch includes: forming a photoresist layer 1704 masking regions of the active layer 138 surrounding the gate region; applying an etchant 1706 to the unmasked regions of the active layer 138; and removing the photoresist layer 1704.

Figure 17B:
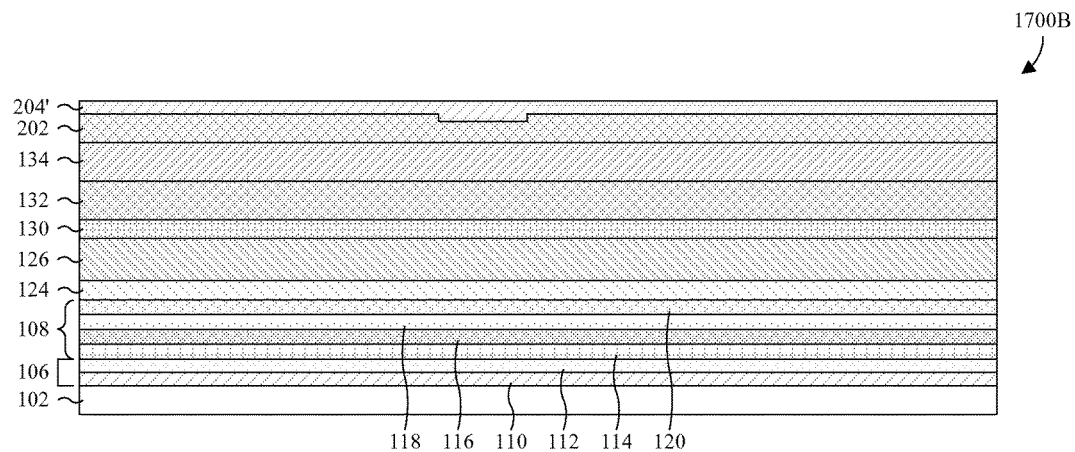

As illustrated by FIG. 17B, a dielectric layer 204' is formed over the remaining active layer 202 and filling the first gate opening 1702. The dielectric layer 204' may be formed using any suitable deposition technique, such as CVD or PVD. The dielectric layer 204' may be formed as, for example, an oxide, such as silicon dioxide.

Figure 17C:
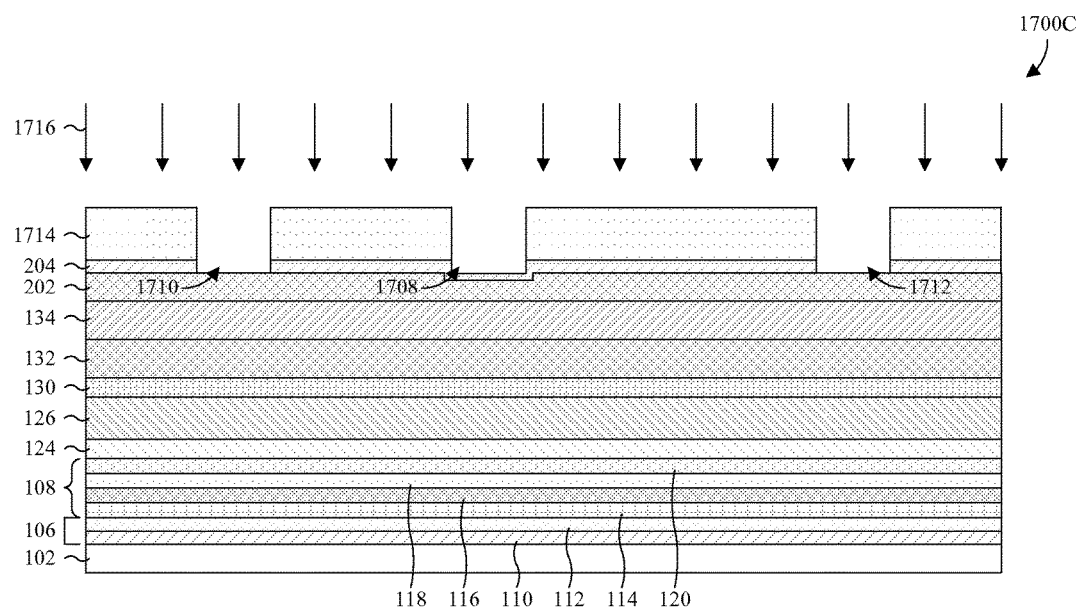

As illustrated by FIG. 17C, a second etch is performed to the remaining active layer 202, through gate and source/drain regions of the dielectric layer 204'. The second etch results in a second gate opening 1708 and source/drain openings 1710, 1712 spaced on opposing sides of the second gate opening 1708. In some embodiments, the process for performing the second etch includes: forming a photoresist layer 1714 masking regions of the dielectric layer 204' surrounding the gate and source/drain regions; applying an etchant 1716 to the unmasked regions of the dielectric layer 204'; and removing the photoresist layer 1714.

Figure 17D:
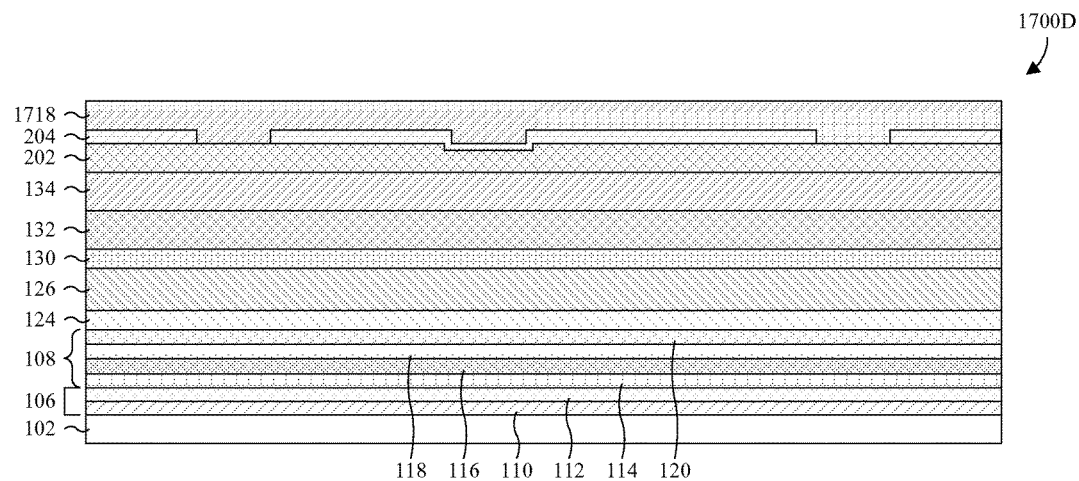

As illustrated by FIG. 17D, a conductive layer 1718 is formed over the remaining dielectric layer 204, and filling the second gate and source/drain openings 1708, 1710, 1712. The conductive layer 1718 may be, for example, a metal, such as copper, or doped polysilicon.

Figure 17E:
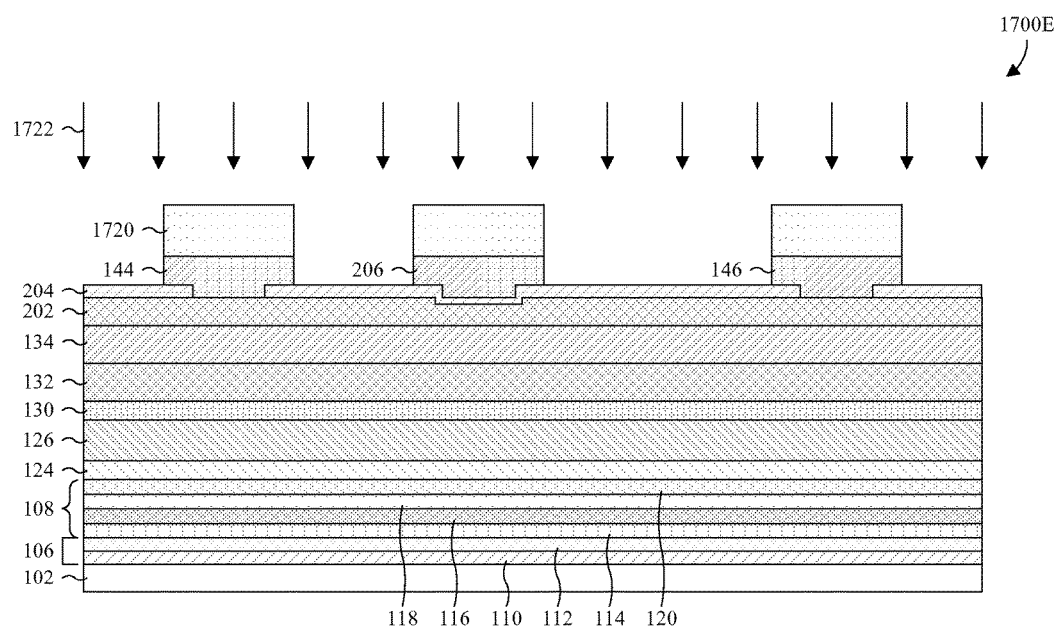

As illustrated by FIG. 17E, a third etch is performed to the remaining dielectric layer 204, through regions of the conductive layer 1718 surrounding source/drain and gate regions. The third etch results in source/drain electrodes 144, 146 and a gate electrode 206. In some embodiments, the process for performing the third etch includes: forming a photoresist layer 1720 masking regions of the conductive layer 1718 surrounding the source/drain and gate regions; applying an etchant 1722 preferential of the conductive layer 1718 relative to the remaining dielectric layer 204; and removing the photoresist layer 1720.

FIGS. 18A-F illustrate cross-sectional views 1800A-F of other embodiments corresponding to Acts 412 and 414, which may be used to form an E-HEMT (e.g., as shown by one example in FIG. 3).

Figure 18A:
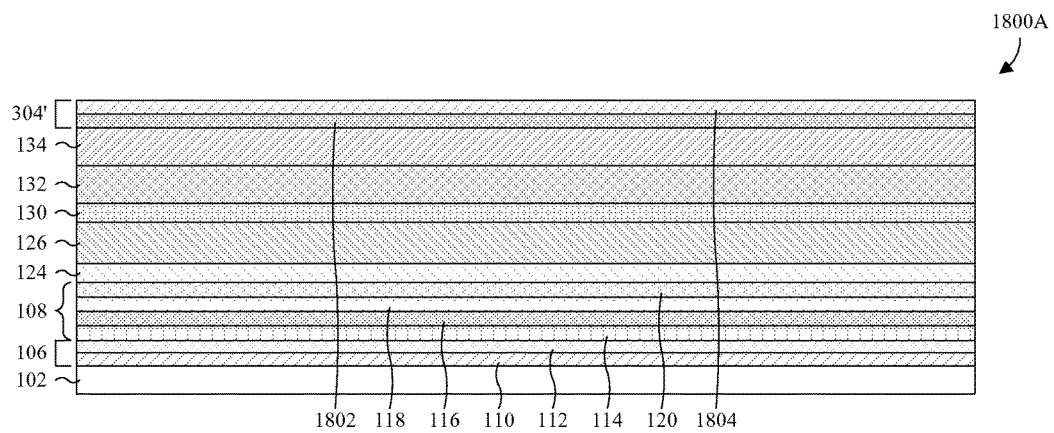

As illustrated by FIG. 18A, a bottom active layer 304' is formed over the channel layer 134 to define a heterojunction at an interface between the bottom active layer 304' and the channel layer 134. In some embodiments, the process for forming the bottom active layer 304' includes forming a single group III-V layer over the channel layer 134. The single group III-V layer is typically formed of AlGaN and/or typically formed with a thickness of about 10-30 nanometer. Further, the single group III-V layer can be formed using any suitable deposition technique, such as MOCVD, MBE, or HVPE, and/or is typically formed at a temperature of about 1000-1150 degrees Celsius. Alternatively, the process for forming the bottom active layer 304' may include forming a multilayer stack, typically including AlN and AlGaN. For example, the bottom active layer 304' may include an AlN layer 1802 and an AlGaN layer 1804 overlying the AlN layer 1802. The AlN layer 1802 is typically formed with a thickness of 0.2-1.5 nanometers, and the AlGaN layer 1804 is typically formed with a thickness of about 10-30 nanometers.

Figure 18B:
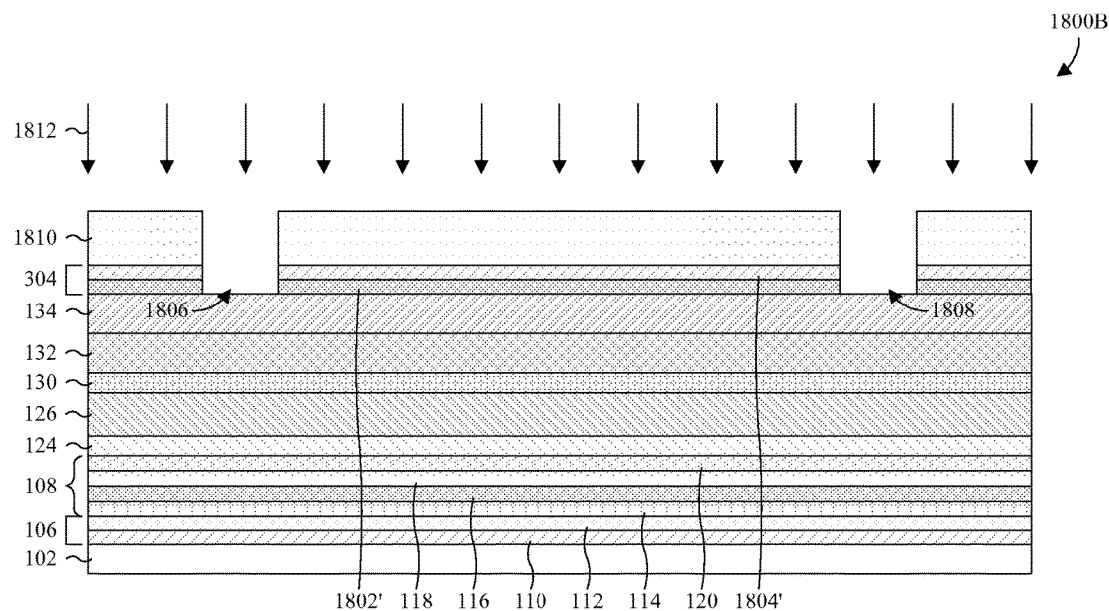

As illustrated by FIG. 18B, a first etch is performed to the channel layer 134, through regions of the bottom active layer 304' overlying source/drain regions. The first etch results in source/drain openings 1806, 1808 in the remaining bottom active layer 304, such as in, for example, a remaining AlN layer 1802' and a remaining AlGaN layer 1804'. In some embodiments, the process for performing the first etch includes: forming a photoresist layer 1810 masking regions of the bottom active layer 304' surrounding the source/drain regions; applying an etchant 1812 according to the photoresist layer 1810, which is preferential of the bottom active layer 304' relative to the channel layer 134; and removing the photoresist layer 1810.

Figure 18C:
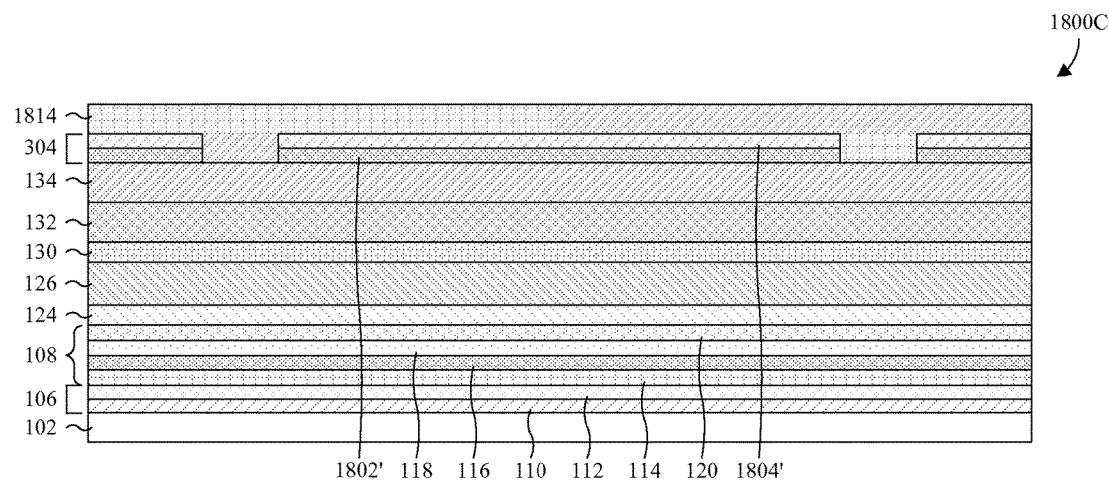

As illustrated by FIG. 18C, a first conductive layer 1814 is formed over the remaining bottom active layer 304, and filling the source/drain openings 1806, 1808. The first conductive layer 1814 may be, for example, a metal, such as copper, or doped polysilicon.

Figure 18D:
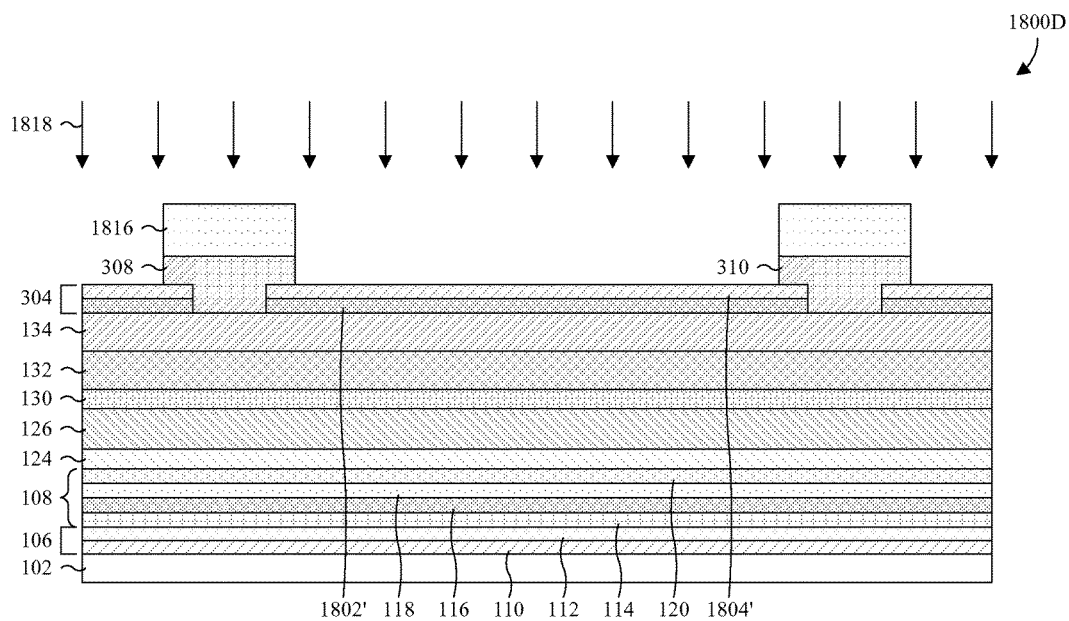

As illustrated by FIG. 18D, a second etch is performed to the remaining bottom active layer 304, through regions of the first conductive layer 1814 surrounding source/drain regions. The second etch results in source/drain electrodes 308, 310. In some embodiments, the process for performing the second etch includes: forming a photoresist layer 1816 masking regions of the first conductive layer 1814 surrounding the source/drain regions; applying an etchant 1818 according to the photoresist layer 1816, which is preferential of the first conductive layer 1814 relative to the remaining bottom active layer 304; and removing the photoresist layer 1816.

Figure 18E:
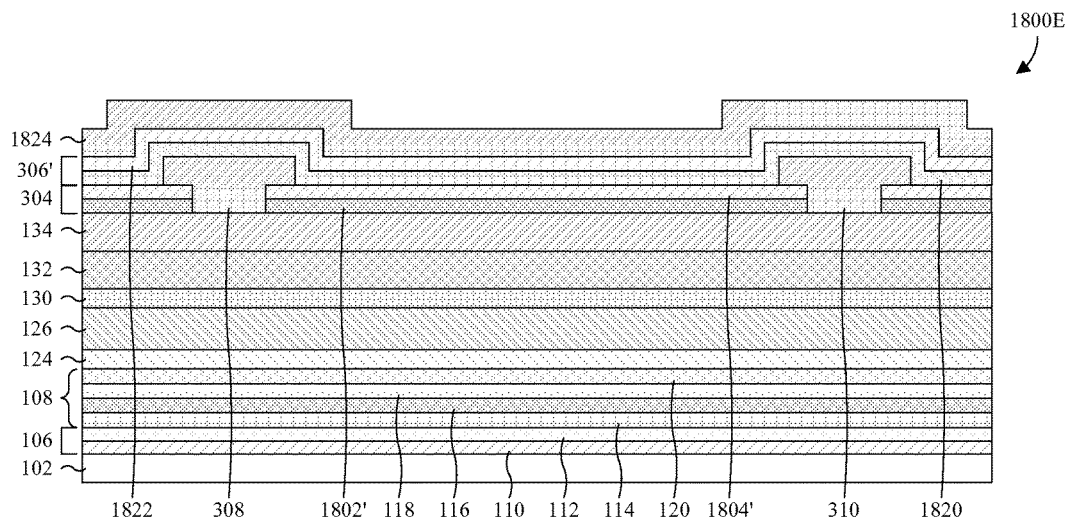

As illustrated by FIG. 18E, a top active layer 306' is formed over the source/drain electrodes 308, 310 and the remaining bottom active layer 304. In some embodiments, the process for forming the top active layer 306' includes forming a single group III-V layer. The single group III-V layer is typically formed of a p- or n-type semiconductor material, such as p- or n-type GaN. For example, the single group III-V layer may be formed by doping a GaN layer with magnesium dopants, typically with a concentration of about $8\text{e}18\ \text{cm}^{-3}$ to about $3\text{e}19\ \text{cm}^{-3}$. The single group III-V layer can be formed using any suitable deposition technique, such as MOCVD, MBE, or HVPE. Typically, the single group III-V layer is formed at a temperature of about 1000-1150 degrees Celsius, and/or with a thickness of about 10-200 nanometer.

Alternatively, in some embodiments, the process for forming the top active layer 306' may include forming a multilayer stack, typically including p- and n-type group III-V layers. For example, the top active layer 306' may include, for example, a p-type GaN layer 1820 and an n-type GaN layer 1822 overlying the p-type GaN layer 1820. The p-type GaN layer 1820 may include, for example, magnesium dopants with a concentration of about $8\text{e}18\ \text{cm}^{-3}$ to about $3\text{e}19\ \text{cm}^{-3}$, and/or may include, for example, a thickness of about 10-200 nanometers. The n-type GaN layer 1822 may include, for example, silicon dopants with a concentration of about $5\text{e}15\ \text{cm}^{-3}$ to about $1\text{e}17\ \text{cm}^{-3}$, and/or may include, for example, a thickness of about 10-200 nanometers. The multilayer stack can be formed using any suitable deposition technique, such as MOCVD, and is typically formed at a temperature of about 1000-1150 degrees Celsius.

Also illustrated by FIG. 18E, a second conductive layer 1824 is formed over the top active layer 306'. The second conductive layer 1824 may be, for example, a metal, such as copper, or doped polysilicon.

Figure 18F:
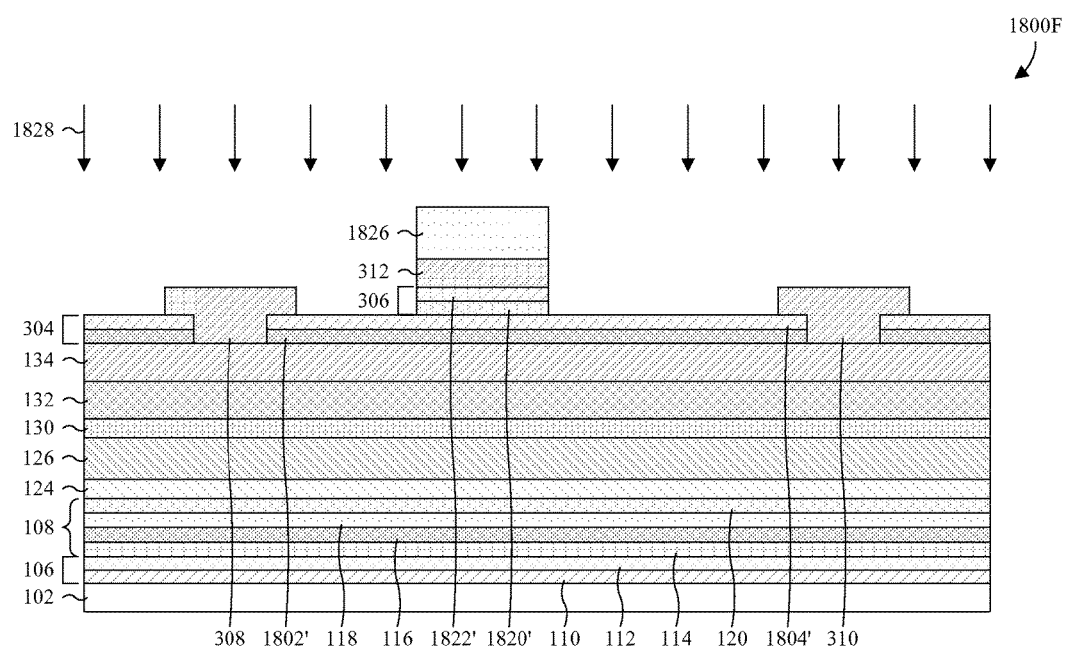

As illustrated by FIG. 18F, a third etch is performed to the remaining bottom active layer 304 and the source/drain electrodes 308, 310, through regions of the second conductive layer 1824 and the top active layer 306' surrounding a gate region. The third etch results in a gate electrode 312 overlying the remaining top active layer 306, such as overlying remaining p-type and n-type GaN layers 1820', 1822'. In some embodiments, the process for performing the third etch includes: forming a photoresist layer 1826 masking regions of the second conductive layer 1824 and the top active layer 306' surrounding the gate region; applying one or more etchants 1828; and removing the photoresist layer 1826.

Thus, as can be appreciated from above, the present disclosure provides a transistor. A first SLS layer is arranged over a substrate. A first buffer layer is arranged over the first SLS layer and includes dopants configured to increase a resistance of the first buffer layer. A second SLS layer is arranged over the first buffer layer. A second buffer layer is arranged over the second SLS layer and includes dopants configured to increase a resistance of the second buffer layer. A channel layer is arranged over the second buffer layer. An active layer is arranged over and directly abuts the channel layer. The channel and active layers collectively define a heterojunction.

In other embodiments, the present disclosure provides a method for manufacturing a transistor. A first SLS layer is formed over a substrate. A first buffer layer is formed over the first SLS layer. The first buffer layer includes a high resistance relative to the first SLS layer. A second SLS layer is formed over the first buffer layer. A second buffer layer is formed over the second SLS layer. The second buffer layer includes a high resistance relative to the second SLS layer. A group III-V heterojunction is formed over the second buffer layer.

In yet other embodiments, the present disclosure provides a transistor. First and second SLS/buffer pairs are stacked in that order over a silicon substrate. The first and second SLS/buffer pairs include corresponding SLS layers and corresponding buffer layers arranged over the corresponding SLS layers. The SLS layers include alternating layers of AlN and GaN. The buffer layers include GaN layers doped with carbon or iron. A channel layer of undoped GaN is arranged over the second SLS/buffer pair. An active layer is arranged over and directly abuts the channel layer. The active layer includes AlGaN, and the channel and active layers collectively define a heterojunction.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A transistor comprising:
    a first strained layer superlattice (SLS) layer arranged over a substrate, wherein the first SLS layer has a first compressive stress, wherein the first SLS layer alternates multiple times between tensile layers and compressive layers, wherein the tensile layers produce a first tensile stress, wherein the compressive layers produce a second compressive stress, and wherein the tensile and compressive layers collectively produce the first compressive stress;
    a first buffer layer arranged over and contacting the first SLS layer, wherein the first buffer layer includes dopants configured to increase a first resistance of the first buffer layer, and wherein the first buffer layer has a second tensile stress that counteracts the first compressive stress;
    a second SLS layer arranged over the first buffer layer;
    a second buffer layer arranged over the second SLS layer and including dopants configured to increase a second resistance of the second buffer layer, wherein the second buffer layer is a single material, and wherein the single material is limited to gallium nitride (GaN);
    a channel layer arranged over and directly contacting the second buffer layer; and
    an active layer arranged over and directly abutting the channel layer, wherein the channel and active layers collectively define a heterojunction.

2. The transistor according to claim 1, wherein the first SLS layer includes about 20 to about 100 pairs of lattice mismatched layers, and wherein a pair of lattice mismatched layers includes layers with mismatched lattice constants.

3. The transistor according to claim 1, wherein the second SLS layer includes about 20 to about 100 pairs of lattice mismatched layers, and wherein a pair of lattice mismatched layers includes layers with mismatched lattice constants.

4. The transistor according to claim 1, further including:
a dielectric layer arranged over the active layer;
a source electrode and a drain electrode arranged over the dielectric layer and extending to the active layer through the dielectric layer; and
a gate electrode arranged over the dielectric layer and between the source electrode and the drain electrode.

5. The transistor according to claim 4, wherein the active layer is one of:
a single layer of aluminum gallium nitride (AlGaN); and
a multilayer stack comprising an aluminum nitride (AlN) layer and an AlGaN layer overlying the AlN layer.

6. The transistor according to claim 1, wherein the first or second SLS layer includes a plurality of pairs of lattice mismatched layers configured to collectively produce a compressive force, wherein a pair of lattice mismatched layers includes layers with mismatched lattice constants, wherein lattice mismatched layers of a pair of lattice mismatched layers are respectively an aluminum nitride (AlN) layer and a gallium nitride (GaN) layer, wherein the GaN layer produces a second compressive force, and wherein the AlN layer produces a second tensile force that is less than the second compressive force.

7. The transistor according to claim 1, wherein the first and second buffer layers are a single material, wherein the first and second SLS layers are each defined by a plurality of pairs of lattice mismatched semiconductor layers, wherein each of the pairs is limited to a single material different than that of the first and second buffer layers, wherein the first and second SLS layers are configured to trap electrons, and wherein the first and second SLS layers are configured to block silicon diffusing from the substrate towards the first and second buffer layers.

8. The transistor according to claim 7, wherein the single material is limited to gallium nitride (GaN).

9. The transistor according to claim 1, further comprising:
a graded buffer layer arranged under the first SLS layer, wherein the graded buffer layer comprises at least three layers of aluminum gallium nitride (AlGaN).

10. The transistor according to claim 9, wherein each of the at least three layers has a different amount of an element common to the at least three layers, and wherein the graded buffer layer is doped with carbon or iron.

11. The transistor according to claim 1, wherein the first and second buffer layers both have resistances greater than a resistance of the channel layer, and wherein doping concentrations of the first and second buffer layers exceed about 1e19 cm$^{-3}$.

12. A transistor comprising:
a silicon substrate;
first and second strained layer superlattice (SLS)/buffer pairs stacked in that order over the silicon substrate, wherein the first and second SLS/buffer pairs include corresponding SLS layers and corresponding buffer layers arranged over the corresponding SLS layers, wherein the SLS layers include alternating layers of aluminum nitride (AlN) and gallium nitride (GaN), wherein the buffer layers include GaN layers doped with carbon or iron, wherein the SLS layers comprise quantum dots configured to trap electrons from the silicon substrate, and wherein the SLS layers are configured to negate tensile stress by the buffer layers;
a channel layer of undoped GaN arranged over the second SLS/buffer pair; and
an active layer arranged over and directly abutting the channel layer, wherein the active layer includes aluminum gallium nitride (AlGaN), and wherein the channel and active layers collectively define a heterojunction;
a gate electrode arranged over the active layer and between a source electrode and a drain electrode, wherein a first portion of the source electrode and a first portion of the drain electrode directly contact the active layer; and
a dielectric layer arranged over and directly contacting the active layer, wherein the dielectric layer separates the gate electrode, a second portion of the source electrode, and a second portion of the drain electrode from the active layer, and wherein the dielectric layer is continuously planar from a sidewall of the first portion of the source electrode to a sidewall of the first portion of the drain electrode.

13. The transistor according to claim 12, wherein the SLS layers each comprise a plurality of pairs of lattice mismatched layers stacked upon one another, and wherein the plurality of pairs of lattice mismatched layers each comprise one of the layers of GaN and one of the layers of AlN arranged over and contacting the one of the layers of GaN.

14. The transistor according to claim 12, wherein the buffer layers both have resistances greater than a resistance of the channel layer, and wherein doping concentrations of the corresponding buffer layers exceed about 1e19 cm$^{-3}$.

15. The transistor according to claim 12, wherein the layers of AlN in the SLS layers have a first lattice constant and the layers of GaN in the SLS layers have a second lattice constant different than the first lattice constant.

16. The transistor according to claim 12, wherein the buffer layers are limited to GaN and have a different concentration of carbon or iron than the SLS layers, wherein the SLS layers are limited to AlN and GaN, wherein the buffers layers and the layers of AlN in the SLS layers have tensile stress, and wherein the layers of GaN in the SLS layers have compressive stress counteracting the tensile stress.

17. The transistor according to claim 12, wherein the sidewall of the first portion of the source electrode faces the gate electrode, wherein the second portion of the source electrode overhangs the sidewall of the first portion of the source electrode, and wherein the dielectric layer is in continuous direct contact with both the source electrode and the active layer from the sidewall of the first portion of the source electrode to a sidewall of the second portion of the source electrode.

18. A transistor comprising:
a silicon substrate;
a seed layer arranged over and directly contacting the silicon substrate, wherein the seed layer comprises aluminum nitride (AlN);
a graded buffer layer arranged over and directly contacting the seed layer, wherein the graded buffer layer comprises at least three layers of aluminum gallium nitride (AlGaN), wherein each of the at least three layers has a different amount of an element common to the at least three layers, and wherein the graded buffer layer is doped with carbon or iron;
a first strained layer superlattice (SLS) layer arranged over and directly contacting the graded buffer layer, wherein the first SLS layer has a first compressive stress, wherein the first SLS layer comprises a first plurality of alternating layers of aluminum nitride (AlN) and gallium nitride (GaN), and wherein the first plurality of alternating layers of AlN and GaN collectively produce the first compressive stress;

a first buffer layer arranged over and directly contacting the first SLS layer, wherein the first buffer layer consists essentially of a single GaN layer doped with carbon or iron, and wherein the first buffer layer has a tensile stress that counteracts the first compressive stress;

a second SLS layer arranged over and directly contacting the first buffer layer, wherein the second SLS layer has a second compressive stress, wherein the second SLS layer comprises a second plurality of alternating layers of AlN and GaN, and wherein the second plurality of alternating layers of AlN and GaN collectively produce the second compressive stress;

a second buffer layer arranged over and directly contacting the second SLS layer, wherein the second buffer layer consists essentially of a single GaN layer doped with carbon or iron, and wherein the second buffer layer has a tensile stress that counteracts the second compressive stress;

a channel layer arranged over and directly contacting the second buffer layer, wherein the channel layer comprises a single undoped GaN layer; and an active layer arranged over and directly contacting the channel layer, wherein the active layer comprises AlGaN, and wherein the channel layer and the active layer collectively define a heterojunction.

19. The transistor according to claim 18, further comprising:

a gate electrode arranged over the active layer and between a source electrode and a drain electrode, wherein a first portion of the source electrode and a first portion of the drain electrode directly contact the active layer; and a dielectric layer arranged over and directly contacting the active layer, wherein the dielectric layer separates the gate electrode, a second portion of the source electrode, and a second portion of the drain electrode from the active layer, and wherein the dielectric layer is continuously planar from a sidewall of the first portion of the source electrode to a sidewall of the first portion of the drain electrode.

20. The transistor according to claim 19, wherein the sidewall of the first portion of the source electrode faces the gate electrode, wherein the second portion of the source electrode overhangs the sidewall of the first portion of the source electrode, and wherein the dielectric layer is in continuous direct contact with both the source electrode and the active layer from the sidewall of the first portion of the source electrode to a sidewall of the second portion of the source electrode.

* * * * *